United States Patent
Klemmer

(10) Patent No.: US 6,337,601 B1
(45) Date of Patent: Jan. 8, 2002

(54) RING OSCILLATOR WITH JITTER RESET

(75) Inventor: Nikolaus Klemmer, Apex, NC (US)

(73) Assignee: Ericsson Inc., Rtp, NC (US)

( * ) Notice: Subject to any disclaimer, the term of this patent is extended or adjusted under 35 U.S.C. 154(b) by 0 days.

(21) Appl. No.: 09/457,750

(22) Filed: Dec. 8, 1999

(51) Int. Cl.[7] .................. H03B 5/02; H03L 7/095; H03L 7/099
(52) U.S. Cl. ............. 331/34; 331/57; 331/117 R; 331/DIG. 2
(58) Field of Search .............. 331/34, 57, 177 R, 331/DIG. 2

(56) References Cited

U.S. PATENT DOCUMENTS

| | | | |
|---|---|---|---|
| 5,559,476 A | * | 9/1996 | Zhang et al. .............. 331/34 |
| 5,847,616 A | * | 12/1998 | Ng et al. .................. 331/57 |
| 5,861,780 A | * | 1/1999 | Fukuda ..................... 331/34 |
| 5,910,740 A | * | 6/1999 | Underwood ............. 327/149 |

FOREIGN PATENT DOCUMENTS

| | | |
|---|---|---|
| GB | 2325803 A | 12/1998 |
| JP | 07231223 A | 8/1995 |

OTHER PUBLICATIONS

Mizuno, Masayuki; Furuta, Koichiro; Andoh; Takeshi; Tanabe; Akira; Tamura, Takao; Miyamoto, Hidenobu; Furukawa, Akio; Yamashina, Masakazu; "A 0.18 μm CMOS Hot–Standby PLL Using a Noise–Immune Adaptive–Gain VCO", IEICE Trans. Electron, vol. E80–C, No. 12, Dec. 1997, pp. 1560–1570.

Thamsirianunt, Manop; Kwasniewski, Tadeusz A.; "CMOS, VCO's for PLL Frequency Synthesis in GHz Digital Mobile Radio Communications", IEEE, vol. 32, No. 10, Oct. 1997, pp. 1511–1524.

* cited by examiner

*Primary Examiner*—Siegfried H. Grimm
(74) *Attorney, Agent, or Firm*—Coats & Bennett, P.L.L.C.

(57) ABSTRACT

An improved low noise oscillator operates by periodically opening a ring oscillator to insert a reference input, thereby resetting any accumulated timing errors. The ring oscillator may be placed within the PLL to function as a voltage controlled oscillator. The loop in the ring oscillator is opened immediately prior to the arrival of the reference signal edge. While the ring oscillator loop is open, the reference signal is fed to the initial inverter instead of the initial inverter of the ring oscillator receiving the output from the last inverter of the ring oscillator. Shortly thereafter, the ring oscillator loop is closed again, and the structure operates as a conventional PLL with a ring oscillator until the next reset. The switching of the ring oscillator input is accomplished via a switch operable between a ring setting (loop back ring oscillator output) and a reset setting (reference signal as input). Switching the input as described restarts the ring oscillator with zero timing error and resets any previously accumulated timing error, thereby reducing phase noise. In preferred embodiments, this reset methodology operates only when the PLL is in a locked mode and large corrections to the output of the oscillator are not required. By employing the improved ring oscillator control method, all the components of a phase-locked loop may be easily integrated into a single ASIC capable of producing very low phase noise signals.

20 Claims, 5 Drawing Sheets

RING OSCILLATOR WITH JITTER RESET

BACKGROUND OF THE INVENTION

1. Field of the Invention

The present invention is directed to phase-locked loops such as are commonly used in mobile communications terminals and other radio frequency receivers.

2. Description of the Related Art

Wireless communications devices, whether one-way or two-way, such as televisions, radios, cellular phones, pagers, personal digital assistants or the like are increasingly common in modern society. However, the convenience and case of use associated with these devices is not something that happens easily or simply. Each device typically receives an incoming electromagnetic signal through an antenna at a frequency that propagates easily through the atmosphere but is not always easily processed by internal electronic components within the device, and certainly not understandable by human senses. To change the frequency of the incoming signal to a frequency that is more easily manipulated, most wireless devices include a heterodyne type receiver that "mixes" the incoming signal with synthesized frequencies to produce lower or "intermediate" frequency outputs that may then be manipulated. In such situations, the synthesized frequencies must typically be generated within very tight frequency tolerances to mix the incoming signals down to the desired intermediate frequencies properly. Additionally, the synthesized frequencies should have little or no noise associated therewith to avoid corrupting or distorting the signal more than necessary.

Frequency synthesis is typically achieved by the use of one or more phase-locked loops (PLLs) that include a resonator driven oscillator and circuitry to ensure that the synthesized frequency is at the desired operating frequency. The most common implementation of such a resonator is based on combinations of inductor and capacitor elements, printed transmission line elements on the Printed Circuit Board (PCB), dielectric resonators, or Surface Acoustic Wave oscillators. While the quality (Q) factors of these resonators are high and phase noise levels of oscillators built from them are low, the oscillators remain "off chip" components that cannot be integrated together on an Application Specific Integrated Circuit (ASIC). Further, these oscillators may comprise up to fifteen elements which take both up space on the PCB and add cost.

Another oscillator used in prior art PLLs is a ring oscillator. Such prior art ring oscillators, while well suited for incorporation into an ASIC, are not considered low noise oscillators because any noise that exists within the oscillator is exacerbated by each pass through the ring oscillator. Another, less common solution to the problem of generating a stable high frequency signal from an accurate and low noise low frequency signal is the use of a delay locked loop (DLL) architecture. However, DLLs are also poorly suited for use in mobile radio applications because the duty cycle of the compare signal must be exactly 50%. If the duty cycle is not exactly 50%, a reference spur appears in the edge combined output signal. These spurs are difficult to filter from the combined signal and detrimentally impact the output.

For the vast majority of receivers, the prior art PLLs are adequate to meet the needs of the device that incorporated the PLL. However, portable receivers, such as those found in mobile terminals, such as pagers, cellular telephones, personal digital assistants, and the like, arc subject to constraints not typically found in televisions, stereos or the like. Specifically, mobile terminals are under increasing pressure to decrease their cost and size. If the PLL, and specifically the oscillator of the PLL, could be integrated into an ASIC, both pressures can be addressed. Integration into an ASIC decreases component cost and makes the device ultimately easier to manufacture, again reducing cost. Integration also eliminates bulky, off chip components, freeing space on the PCB and generally reducing the size of the mobile terminal.

Thus, while low noise integrated oscillators are highly desirable for mobile terminals, the presently available devices have proven less than satisfactory. Resonators cannot be incorporated into ASICs; ring oscillators are too noisy; and DLLs are too frequency limiting. Thus, there remains a specific need for a low noise oscillator that can be incorporated into an ASIC. Such an low noise oscillator could be used for a wide variety of applications including without limitation frequency synthesis, frequency multipliers to accelerate clock speeds, pulse to synchronization, clean signal generation for transmission, FM and AM detection, and the like.

BRIEF SUMMARY OF THE INVENTION

The improved low noise oscillator of the present invention operates by selectively opening a ring oscillator to insert a reference input. Preferably, this reference input is inserted once per period of the reference signal, thereby resetting any accumulated timing errors (e.g., phase noise) each period. The improved low noise oscillator may be best illustrated in the context of an improved phase-locked loop (PLL).

In preferred embodiments, the ring oscillator is placed within the PLL, functioning as a voltage controlled oscillator. As is customary in the prior art, the PLL receives a periodic reference signal from a reference oscillator, sometimes called the compare signal. However, unlike the ring oscillators of the prior art, the loop in the ring oscillator is opened immediately prior to the arrival of the compare signal edge. While the ring oscillator loop is open, the reference signal is fed to the initial inverter instead of the initial inverter of the ring oscillator receiving the output from the last inverter of the ring oscillator. Shortly thereafter, the ring oscillator loop is closed again, and the structure operates as a conventional PLL with a ring oscillator until the next reset. The switching of the ring oscillator input is preferably accomplished via a switch operable between a ring setting (loop back ring oscillator output) and a reset setting (reference signal as input). It is believed that switching the input as described restarts the ring oscillator with zero timing error and resets any previously accumulated timing error, thereby reducing phase noise. In preferred embodiments, this reset methodology operates only when the PLL is in a locked mode and large corrections to the output of the oscillator are not required.

By employing the improved ring oscillator control method, all the components of a phase-locked loop may be easily integrated into a single ASIC capable of producing very low phase noise signals, such as would be useful in a heterodyne receiver for telecommunications applications.

DETAILED DESCRIPTION OF THE PREFERRED EMBODIMENT(S)

Figure 1:
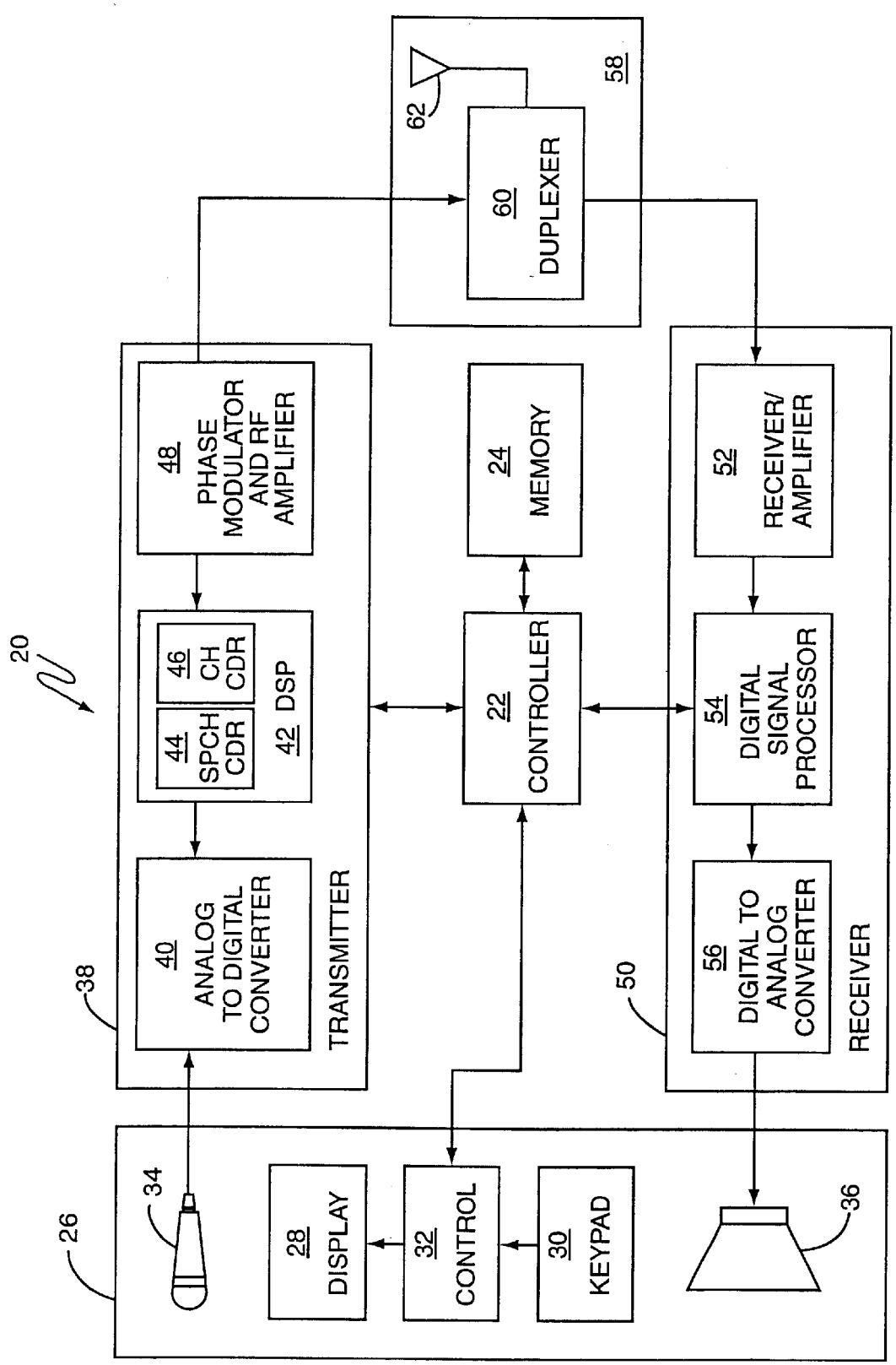
FIG. 1 is a schematic drawing of a mobile terminal capable of incorporating the present invention.

The present invention provides a phase-locked loop with a low noise oscillator that is easily integratable into an ASIC. This PLL is well suited for use in a frequency synthesizer used in a receiver chain in a mobile terminal. A discussion of a mobile terminal is helpful to understand the context before providing the details associated with the phase-locked loop of the present invention.

A mobile terminal 20 typically includes a controller 22, an operator interface 26, a transmitter 38, a receiver 50, and an antenna assembly 58. The operator interface 26 typically includes a display 28, keypad 30, control unit 32, microphone 34, and a speaker 36. The display 28 allows the operator to see dialed digits, call status, and other service information. The keypad 30 allows the operator to dial numbers, enter commands, and select options. The control unit 32 interfaces the display 28 and keypad 30 with the controller 22. The microphone 34 receives acoustic signals from the user and converts the acoustic signals to an analog electrical signal. The speaker 36 converts analog electrical signals from the receiver 50 to acoustic signals which can be heard by the user.

The analog electrical signal from the microphone 34 is supplied to the transmitter 38. The transmitter 38 includes an analog to digital converter 40, a digital signal processor 42, and a phase modulator and RF amplifier 48. The analog to digital converter 40 changes the analog electrical signal from the microphone 34 into a digital signal. The digital signal is passed to the digital signal processor (DSP) 42, which contains a speech coder 44 and channel coder 46. The speech coder 44 compresses the digital signal and the channel coder 46 inserts error detection, error correction and signaling information. The DSP 42 may include, or may work in conjunction with, a DTMF tone generator (not shown). The compressed and encoded signal from the digital signal processor 42 is passed to the phase modulator and RF amplifier 48, which are shown as a combined unit in FIG. 1. The modulator converts the signal to a form which is suitable for transmission on an RF carrier. The RF amplifier 48 then boosts the output of the modulator for transmission via the antenna assembly 58.

The receiver 50 includes a receiver/amplifier 52, digital signal processor 54, and a digital to analog converter 56. Signals received by the antenna assembly 58 are passed to the receiver/amplifier 52, which shifts the frequency spectrum, and boosts the low-level RF signal to a level appropriate for input to the digital signal processor 54.

The digital signal processor 54 typically includes an equalizer to compensate for phase and amplitude distortions in the channel corrupted signal, a demodulator for extracting bit sequences from the received signal, and a detector for determining transmitted bits based on the extracted sequences. A channel decoder detects and corrects channel errors in the received signal. The channel decoder also includes logic for separating control and signaling data from speech data. Control and signaling data is passed to the controller 22. Speech data is processed by a speech decoder and passed to the digital to analog converter 56. The digital signal processor 54, may include, or may work in conjunction with, a DTMF tone detector (not shown). The digital to analog converter 56 converts the speech data into an analog signal which is applied to the speaker 36 to generate acoustic signals which can be heard by the user. The antenna assembly 58 is connected to the RF amplifier of the transmitter 38 and to the receiver/amplifier 52 of the receiver 50. The antenna assembly 58 typically includes a duplexer 60 and an antenna 62. The duplexer 60 permits full duplex communications over the antenna 62. The controller 22 coordinates the operation of the transmitter 38 and the receiver 50, and may for instance take the form of a common microprocessor. This coordination includes power control, channel selection, timing, as well as a host of other functions known in the art. The controller 22 inserts signaling messages into the transmitted signals and extracts signaling messages from the received signals. The controller 22 responds to any base station commands contained in the signaling messages, and implements those commands. When the user enters commands via the keypad 30, the commands are transferred to the controller 22 for action. Memory 24 stores and supplies information at the direction of the controller 22 and preferably includes both volatile and non-volatile portions.

Figure 2:
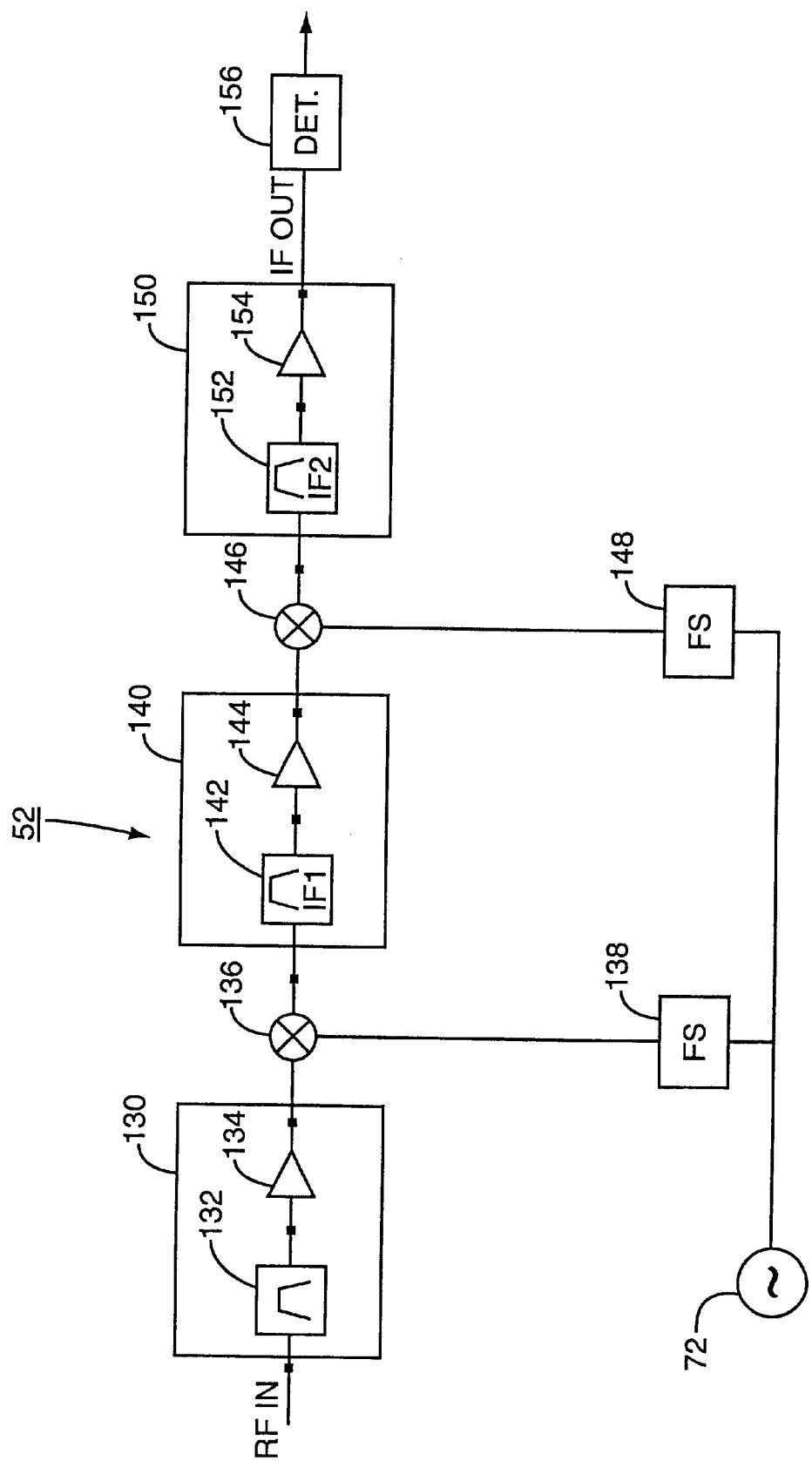
FIG. 2 is a schematic drawing of a receiver chain as used in the mobile terminal of FIG. 1.

At the next level of detail, the receiver 52 is shown in FIG. 2. Receiver 52 includes a front end 130, a first mixer 136, a first intermediate frequency stage 140, a second mixer 146, a second intermediate frequency stage 150, and a detector 156. Signals received by the antenna 62 are applied to the input of front end 130. Front end 130 includes a preselector filter 132 and low-noise amplifier 134. The preselector filter 132 suppresses signals outside the primary band. The low-noise amplifier 134 increases the strength of the received signals passed by the filter 132. The mixer 136 converts the received signals to a first intermediate frequency. The injection signal for the mixer is provided by a first frequency synthesizer 138. The frequency synthesizer 138 is preferably a PLL.

The output of mixer 136 is connected to the input of a first intermediate frequency stage 140. The first intermediate frequency stage 140 comprises a first intermediate frequency filter 142 followed by a first intermediate frequency amplifier 144. The purpose of the first intermediate frequency filter 142 is to reject the image frequency with respect to the second intermediate frequency and to provide some degree of adjacent channel suppression.

The output of the first intermediate frequency stage 140 is connected to the signal input port of the second mixer 146. The second mixer 146 converts the received signal to a second intermediate frequency. The injection signal for the second mixer 146 is provided by a second frequency synthesizer 148. The frequency synthesizer 148 is preferably a PLL.

The output of the second mixer 146 is connected to the input of a second intermediate frequency stage 150 which comprises a second intermediate frequency filter 152 followed by a second intermediate frequency amplifier 154. The purpose of the second intermediate frequency filter 152 is to provide further adjacent channel suppression. The output of the second intermediate frequency stage 150 is connected to a detector 156 whose design is chosen according to the modulation scheme employed. For example, a receiver for FM signals would use a limiter followed by a discriminator as its detector, whereas a receiver for single sideband suppressed carrier signals would use a product detector or a synchronous detector.

Figure 3:
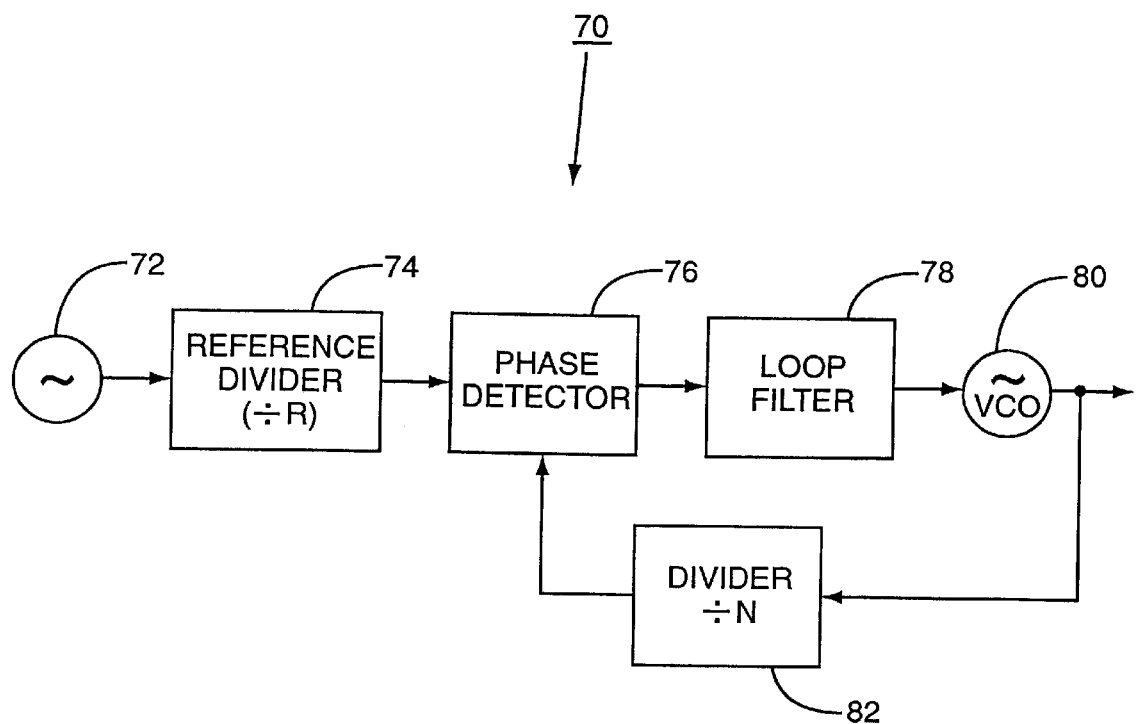
FIG. 3 is schematic drawing of a prior art phase-locked loop.

In the prior art, the frequency synthesizers 138 and 148 are made from conventional phase-locked loops such as shown in FIG. 3, which shows a typical prior art PLL 70.

PLL 70 includes an oscillator 72, a reference divider 74, a phase detector 76, a filter 78, a low phase noise voltage controlled oscillator (VCO) 80, and a feedback divider 82. PLL 70 takes the known output of the reference oscillator 72 and sends it through the reference divider 74. Reference oscillator 72 generates a periodic signal at a fixed frequency that is known a priori within the mobile terminal 20 or other device in which the reference oscillator 72 is used. Further, the reference signal generated by the reference oscillator 72 is a periodic signal with rising and falling edges, for example a square wave. This divided reference signal is injected into the phase detector 76. Phase detector 76 is in turn connected to the filter 78 and the VCO 80. VCO 80 generates a periodic signal with rising and falling edges. This output signal from VCO 80 is the signal that is used in a mixer (such as mixer 136 or 146 in FIG. 2) or the like as required by the mobile terminal 20 incorporating the PLL 70. Additionally, the output from the VCO 80 is directed back to the phase detector 76 through the feedback divider 82. Phase detector 76 compares the inputs from the divider 82 and the reference divider 84 and generates a correction signal, typically through a charge pump, to correct the output of the VCO 80 to match its phase to the phase of the input of the reference divider 74. That is, the phase detector 76 generates a signal which is filtered and then controls the VCO 80 so that VCO 80 outputs a signal that is at the correct frequency and phase. As noted, the VCO 80 in the conventional PLL 70 is an off chip component including approximately fifteen elements. This arrangement is bulky and expensive.

Figure 4:
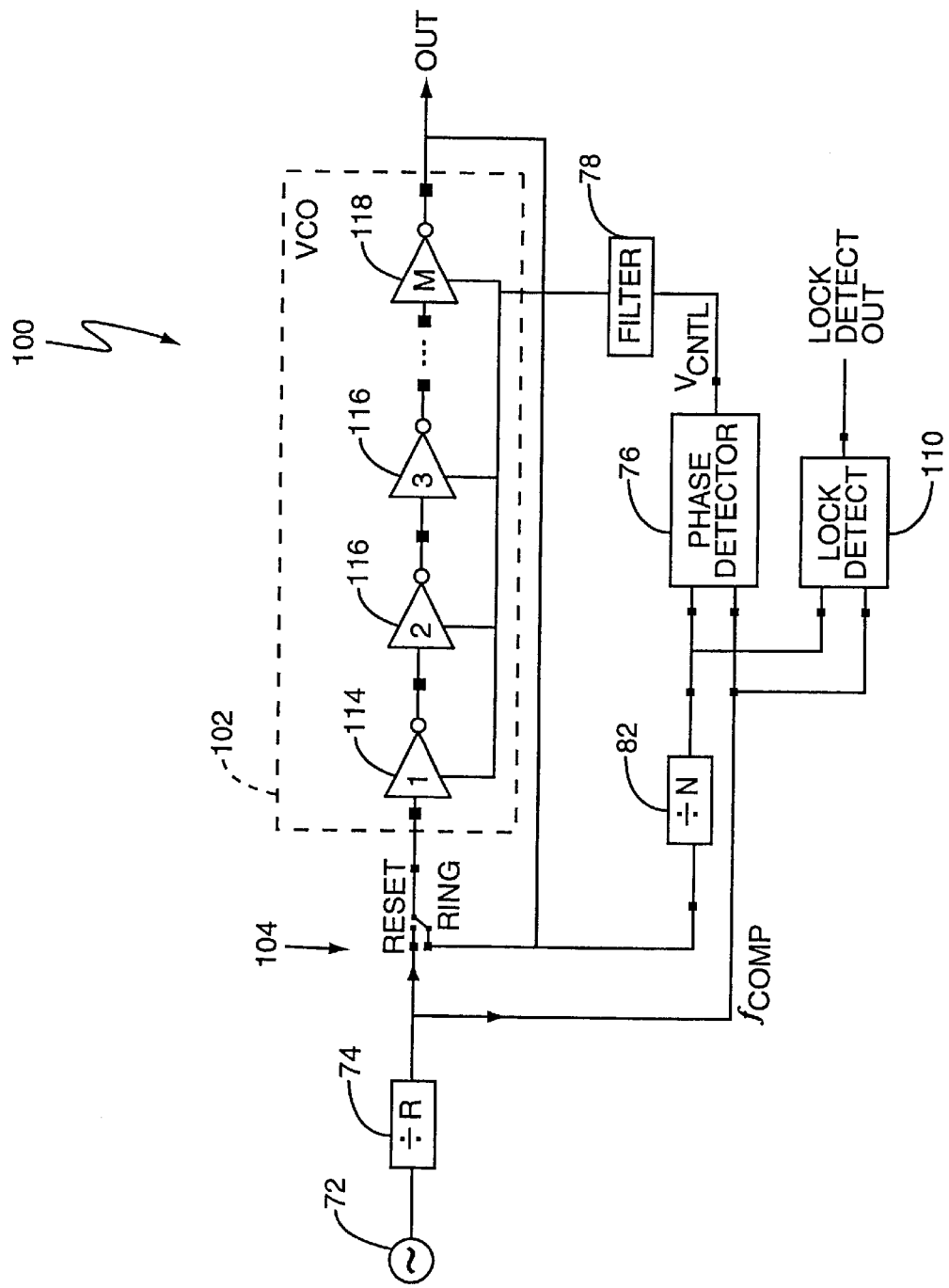
FIG. 4 is a schematic drawing of a first embodiment of the phase-locked loop of the present invention.

One solution to the problems of the prior art may be seen in FIG. 4, wherein an improved PLL 100 is shown schematically. PLL 100 includes a ring oscillator 102, a switch 104, a feedback divider 82, a phase detector 76, a lock detect circuit 110 and a filter 78. Ring oscillator 102 typically includes a delay element whose output is fed back as the input to the delay element. The delay element of the ring oscillator 102 may take a wide variety of forms. For illustrative purposes, the ring oscillator 102 of FIG. 4 includes a delay element that takes the form of a delay chain having a plurality of inverters, namely first inverter 114, intermediate inverters 116, and final inverter 118. It is possible that there are an even or an odd number of inverters. In the event that there are an even number of inverters, the ring oscillator 102 may be implemented as a differential ring oscillator as is well understood in the art. Each inverter 114, 116 or 118 includes an input, a control, and an inverted output as is conventional. Final inverter 118 does not feed directly into another inverter as the previous inverters 116 do, but rather produces the output of the ring oscillator 102. The output is fed back into the feedback divider 82, and potentially back into the first inverter 114 depending on the setting of switch 104. Switch 104 selects the input to the ring oscillator 102 between at least two settings, ring and reset, selecting between an input of the fed back output signal from inverter 118 or an input of the reference signal, respectively. Switch 104 may take any form known in the art, including a mechanical switch, but switch 104 is preferably an electrical switch suitable for integration on a semiconductor computer chip. In a conventional ring oscillator, switch 104 is not present, and the output of the final inverter 118 is always directed in a closed loop to the input of the first inverter 114. Of course, it may be necessary that the delayed output signal from inverter 118, i.e., the output of ring oscillator 102, be inverted in its polarity with respect to the un-delayed input signal into inverter 114, i.e., the input into ring oscillator 102. Phase detector 76 compares the signal coming from the output of the last inverter 118 with the compare or reference signal ($f_{comp}$) derived from the reference oscillator 72 to determine if the two signals are in phase. The compare signal may come directly from the reference oscillator 72 or may be via optional reference divider 74. Thus, for purposes of this illustration, either the reference oscillator 72 or the reference divider 74 may be considered the source for the reference signal (i.e., the reference source). Phase detector 76 typically performs the phase comparison by comparing either a rising or falling edge from each of the two respective signals. If the signals are close enough in time, the lock detect circuit 110 notes that there is a lock. If the signals are out of phase, a control signal from the phase detector 76, as filtered by the filter 78, is used to bring the ring oscillator 102 into phase with the compare signal. It should be noted that lock detect circuit 110 has been incorporated into the phase detector 76 in FIG. 3, but is shown distinctly in FIG. 4 to assist in the understanding of the operation of the new PLL 100.

As further noted, the use of ring oscillators in phase-locked loops is known, and allows incorporation of the oscillator into an ASIC, but prior art ring oscillators are not low noise oscillators as are required in radio communications terminals. Phase noise accumulates in prior art ring oscillators each time the trigger signal passes through the ring oscillator. The present invention solves this problem by providing the switch 104 which periodically resets the accumulated phase noise within the ring oscillator 102.

When the PLL 100 is initially turned on, PLL 100 will likely not be in phase with the compare signal from the reference oscillator 72. During this out-of-phase stage, the noise or jitter reset feature should be disabled; that is, the switch 104 should be in the ring position. When the switch 104 is in the ring position, the loop of the ring oscillator 102 is closed and the ring oscillator 102 operates conventionally. Normal PLL dynamics apply and are well understood. This startup period allows the output signal of the PLL 100 to become phase locked to the compare signal after an initial locking transient.

After the locking transient has decayed, the relevant edges of the signal at the output of the feedback divider 82 and the compare signal arrive at the input of the phase detector 76 at almost identical times. The difference is arrival times is only a fraction of the output frequency period, and in fact, typically less than one percent of output frequency period of the ring oscillator 102. Preferably, the noise or jitter resetting mode is enabled only when this lock is detected by the lock detect circuit 110.

The noise or jitter resetting mode is driven preferably by the feedback divider 82. Feedback divider 82 is preferably implemented as a digital down-counter. The feedback signal edge from the output of ring oscillator 102 will appear at the feedback divider 82 when the counter state reaches zero. The difference in arrival times of the feedback edge and the compare signal edge is significantly less than one cycle of the ring oscillator 102 output signal. The state of the feedback divider 82 changes at the rate of the ring oscillator 102 output frequency; e.g., counting down by one every time a leading edge of the output signal arrives from the ring oscillator 102. Switch 104 can therefore be changed from "RING" to "RESET" once the feedback divider 82 state counts down to one, thereby opening the loop within the ring oscillator 102. Due to inherent delays, this will allow the last output signal edge from inverter 118 before reset to pass the switch 104 undisturbed and into first inverter 114. When the counter state reaches zero upon the following output edge, a compare signal edge from reference oscillator 72 is fed into the now open ring oscillator 102. Preferably, one half period of the output signal from ring oscillator 102 later, the switch 104 will be returned to the "RING" position, thereby closing the ring oscillator 102 again. This coincides with the reloading of the feedback division counter embodied in the feedback divider 82, and the reloading can therefore also trigger the switch 104. This switching is comparable to the switching experienced in a delay locked loop. Heretofore, no PLL has combined these features.

It should be noted that the lock detect circuit 110 preferably enables and disables this jitter reset functionality of the feedback divider 82 and the switch 104, based on the locking state as described above.

This periodic reset of the input of the ring oscillator 102 dramatically lowers the noise within the ring oscillator 102. For example, a free running ring oscillator in a wireless communications mobile terminal by itself may exhibit a center frequency of 100 MHz and a phase noise level of −95 dBc/Hz at the 100 kHz offset frequency. The delay and delay jitter per stage, assuming a four-inverter structure is 1.25 ns and 0.63 ps respectively. If we choose a 2MHz compare frequency, the feedback division ratio will be $N=f_{out}/f_{comp}=50$. Altogether, this new arrangement will have a close-in phase noise level of −110 dBc/Hz. The phase noise far away from the carrier will decay at a rate of −20 dB/decade with a corner frequency $Off_{comp}/2=1$ MHz. To achieve the same phase noise shape in a conventional PLL using the same oscillator, a loop bandwidth equal to the 1 MHz corner frequency from above needs to be chosen. To make the implementation feasible, the comparison frequency of the PLL would then have to be about ten times higher than the loop bandwidth (to suppress sampling effects). A feasible comparison frequency will be on the order of 10 MHz, which restricts the choice of carrier frequencies on a 10 MHz raster rather than the 2 MHz from above. Furthermore, using a PLL, the phase noise 1 MHz offset from the carrier will be −105 dBc/Hz, whereas the jitter-reset structure only has a phase noise level of −110 dBc/Hz. Thus, the present invention performs much better than the prior art PLLs that incorporated ring oscillators.

Figure 5:
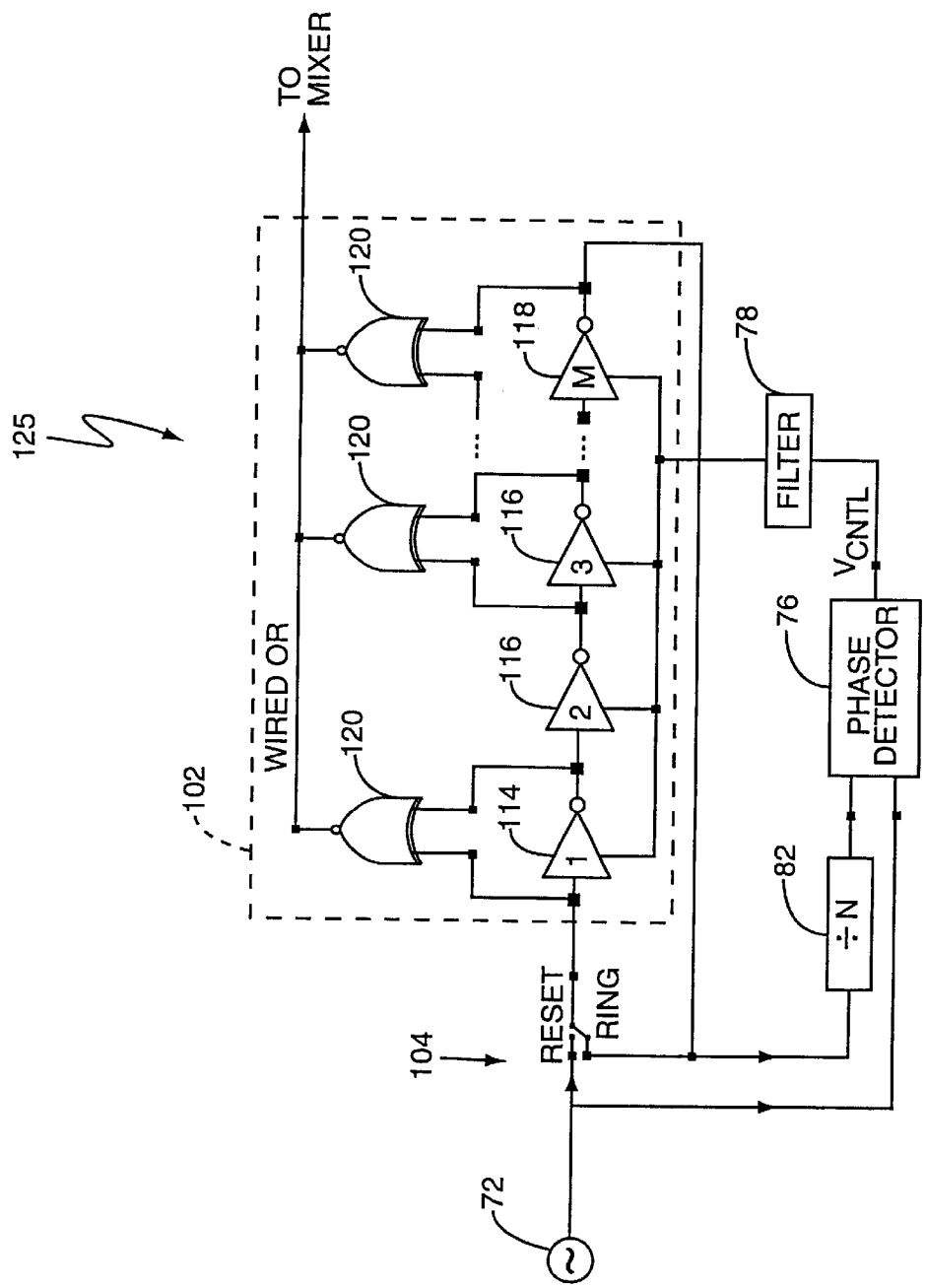
FIG. 5 is a schematic drawing of a second embodiment of the phase-locked loop of the present invention.

An alternate, and less preferred embodiment is seen in FIG. 5, wherein a PLL 125 is substantially similar to the PLL 100. However, an XOR gate 120 is positioned around every odd numbered inverter within the ring oscillator 102. Thus, the first inverter 114, the third inverter 116, and the final inverter 118 ($5^{th}$, $7^{th}$, or the like) have an XOR 120 positioned with an input line from both the input and output of each odd inverter as shown. The final output of the ring oscillator 102 of FIG. 5 comes from the combined signal created by the XORs 120. However, the use of the combined XORs 120 recreates the situation in delay locked loops wherein the delays of the individual inverters 114,116,118 need to be matched exactly to eliminate spurs. Because it is difficult to achieve perfect delay matching, this implementation, while possible, is not preferred.

In general, both inverters and XOR gates are capable of being incorporated into an ASIC, thus allowing all the elements of the PLL 100 or 125 to be integrated into an ASIC. As noted, this reduces the number of components required in the manufacturing process and reduces the size requirements of the circuit board placed in the device. This is particularly helpful as noted in mobile terminals, although it is conceivable that a portable radio or the like may wish to minimize the number and size of internal components.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of controlling a phase-locked loop having a ring oscillator, the ring oscillator having a delay element having an input and an output and a feedback loop normally operatively connecting said output to said input, said method comprising:

opening the feedback loop of the ring oscillator;

applying a reference signal from a reference source to the input of the delay element while said feedback loop is open; and closing the feedback loop of the ring oscillator after application of the reference signal;

wherein said opening and said closing are performed by a switch and wherein said switch is operable between a ring setting and a reset setting, said switch closing said feedback loop of said ring oscillator in said ring setting, said switch opening said feedback loop of said ring oscillator in said reset setting; and wherein said phase-locked loop further includes a countdown type feedback divider in communication with said switch, said feedback divider generating a signal instructing said switch to change from said ring setting to said reset setting.

2. The method of claim 1 wherein the step of opening the feedback loop of the ring oscillator comprises periodically opening the feedback loop of said ring oscillator.

3. The method of claim 1 wherein said reference signal is a periodic signal and wherein said opening occurs once per period of said reference signal.

4. The method of claim 1 wherein the step of applying a reference signal to the input of the delay element comprises accepting a signal edge of the reference signal from the reference source.

5. The method of claim 4 wherein said signal edge is a leading edge and wherein said opening occurs proximate in time with said leading edge.

6. The method of claim 4 wherein said signal edge is a trailing edge and wherein said opening occurs proximate in time with said trailing edge.

7. The method of claim 1 further comprising forming said phase-locked loop on a single semiconductor chip.

8. A ring oscillator comprising:

a plurality of inverters connected in series including a first inverter and a last inverter wherein an output of said last inverter is looped back to an input of said first inverter;

a switch connected to the output of said last inverter and the input of said first inverter and a reference source, said switch having a ring setting and a reset setting, said switch connecting said input to said output in said ring setting and connecting said input to said reference source in said reset setting;

said switch periodically assuming said reset setting for a short duration and then returning to said ring setting; and a plurality of exclusive OR components, each surrounding a different one of said inverters.

9. The ring oscillator of claim 8 wherein said plurality of inverters comprises an odd number of inverters.

10. The ring oscillator of claim 1 wherein said plurality of inverters comprises an even number of inverters.

11. The ring oscillator of claim 1 wherein said reset setting reduces phase noise within the ring oscillator.

12. The ring oscillator of claim 1 wherein said ring oscillator is incorporated into a single semiconductor chip.

13. A phase-locked loop capable of operating in two modes, said phase-locked loop comprising:
a ring oscillator having an output;
a switch operatively connected to an input of said ring oscillator for selectively switching between first and second modes;
wherein in said first mode, said ring oscillator operates in a closed fashion receiving input from the output of said ring oscillator; and
wherein in said second mode, said ring oscillator operates in an open fashion, receiving input from a reference oscillator; and
wherein said ring oscillator comprises a plurality of inverters and a plurality of exclusive OR components, each of said exclusive OR components surrounding different ones of said plurality of inverters.

14. The phase-locked loop of claim 13 wherein receiving input from a reference oscillator reduces phase-noise in said ring oscillator.

15. The phase-locked loop of claim 13 further comprising a phase detector operatively connected to said ring oscillator output and receiving a compare signal from the reference oscillator.

16. The phase-locked loop of claim 15 wherein said phase detector includes a lock detect circuit operative to detect when said output is locked with respect to said compare signal and generate a signal enabling said switch to assume said second mode when lock is detected.

17. A phase-locked loop capable of operating in two modes, said phase-locked loop comprising:
a ring oscillator having an output;
a switch operatively connected to an input of said ring oscillator for selectively switching between first and second modes;
wherein in said first mode, said ring oscillator operates in a closed fashion receiving input from the output of said ring oscillator; and
wherein in said second mode, said ring oscillator operates in an open fashion, receiving input from a reference oscillator; and
a countdown type feedback divider in communication with said switch, said feedback divider generating a signal to control the timing of said switch's changes from said first mode to said second mode.

18. The phase-locked loop of claim 17 wherein receiving input from a reference oscillator reduces phase-noise in said ring oscillator.

19. The phase-locked loop of claim 17 further comprising a phase detector operatively connected to said ring oscillator output and receiving a compare signal from the reference oscillator.

20. The phase-locked loop of claim 19 wherein said phase detector includes a lock detect circuit operative to detect when said output is locked with respect to said compare signal and generate a signal enabling said switch to assume said second mode when lock is detected.

* * * * *